(12) United States Patent
Lee et al.

(10) Patent No.: US 9,734,916 B2
(45) Date of Patent: Aug. 15, 2017

(54) READING METHOD FOR A CELL STRING

(71) Applicant: SNU R&DB FOUNDATION, Seoul (KR)

(72) Inventors: Jong-Ho Lee, Seoul (KR); Sung-Min Joe, Daegu (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/753,441

(22) Filed: Jun. 29, 2015

(65) Prior Publication Data

US 2016/0005479 A1  Jan. 7, 2016

(30) Foreign Application Priority Data

Jul. 2, 2014 (KR) ........................ 10-2014-0082543

(51) Int. Cl.
*G11C 11/34* (2006.01)
*G11C 16/04* (2006.01)
(Continued)

(52) U.S. Cl.
CPC .......... *G11C 16/26* (2013.01); *G11C 11/5642* (2013.01); *G11C 16/0483* (2013.01);
(Continued)

(58) Field of Classification Search
CPC . G11C 16/0483; G11C 16/26; G11C 16/3427; G11C 16/3436; G11C 16/34
See application file for complete search history.

(56) References Cited

U.S. PATENT DOCUMENTS 7,668,013 B2 * 2/2010 Chern ................ G11C 16/16
365/185.05
2006/0044872 A1 * 3/2006 Nazarian ............ G11C 16/0483
365/185.17
(Continued)

FOREIGN PATENT DOCUMENTS

KR   1020090085439   8/2009
KR   1020120130902   12/2012

OTHER PUBLICATIONS

Jaehoon Jang et al., Vertical Cell Array using TCAT(Terabit Cell Array Transistor) Technology for Ultra High Density NAND Flash Memory, 2009 Symposium on VLSI Technology Digest of Technical Papers, pp. 192-193.
(Continued)

*Primary Examiner* — Kretelia Graham
(74) *Attorney, Agent, or Firm* — Cantor Colburn LLP

(57) ABSTRACT

A reading method for a cell string using multiple pass voltages includes a pre-charging step and a reading step to read a selected word line cell WL[k]. The pre-charging step comprises applying a positive pass voltage ($V_{pass1}$) to the selected word line (WL[k]), the upper word lines (Upper WL) of the selected word line (WL[k]), at least one the lower word lines adjacent to the selected word line (WL[k]); and applying a negative pass voltage ($V_{pass2}$) to the remaining lower word lines (Lower WL) except for WL[k-1]. The reading step comprises applying sequentially a first voltage which is lower than a read voltage ($V_{verify}$) and the read voltage ($V_{verify}$) to the selected word line WL[k], applying a second voltage to a common source line CSL and the unselected word lines and sensing a current or a voltage of the selected word line WL[k], thereby reading information stored in the selected word line WL[k].

10 Claims, 16 Drawing Sheets

(51) Int. Cl.
*G11C 16/26* (2006.01)
*G11C 16/34* (2006.01)
*G11C 11/56* (2006.01)
*G11C 16/08* (2006.01)
*G11C 8/08* (2006.01)

(52) U.S. Cl.
CPC .............. *G11C 16/08* (2013.01); *G11C 16/34* (2013.01); *G11C 16/3427* (2013.01); *G11C 16/3436* (2013.01); *G11C 8/08* (2013.01)

(56) References Cited

U.S. PATENT DOCUMENTS

| | | | |
|---|---|---|---|
| 2010/0008165 A1* | 1/2010 | Macerola ............ | G11C 11/5642 365/189.15 |
| 2013/0077404 A1* | 3/2013 | Nawata .................. | G11C 16/10 365/185.17 |
| 2013/0163339 A1* | 6/2013 | Kim ........................ | G11C 16/24 365/185.18 |
| 2015/0003157 A1* | 1/2015 | Aritome ............. | G11C 16/0408 365/185.11 |
| 2015/0131381 A1* | 5/2015 | Rhie ...................... | G11C 16/14 365/185.17 |
| 2015/0348639 A1* | 12/2015 | Lee .................... | H01L 27/1157 365/185.12 |

OTHER PUBLICATIONS

Hang-Ting Lue et al., A Novel Dual-Channel 3D NAND Flash Featuring both N-Channel and P-Channel NAND Characteristics for Bit-alterable Flash Memory and a New Opportunity in Sensing the Stored Charge in the WL Space, IEEE, 2013, pp. 3.7.1-3.7.4.

* cited by examiner

READING METHOD FOR A CELL STRING

CROSS-REFERENCE TO RELATED PATENT APPLICATION

This application claims the benefit of Korean Patent Application No. 10-2014-0082543, filed on Jul. 2, 2014 in the Korean Intellectual Property Office, the disclosure of which is incorporated herein in its entirety by reference.

BACKGROUND OF THE INVENTION

1. Field of the Invention

The present invention relates to a reading method for a cell string, and more particularly, to a reading method for a cell string wherein is capable of providing the steep switching characteristics and reducing distribution of a turn-on voltage by using positive feedback in the cell string, which the cell string includes a plurality of control electrodes and selection devices formed on a surface of a semiconductor body where a channel is formed and the first and second semiconductor regions formed at respective ends of the semiconductor body.

2. Description of the Related Art

Various researches have been made in order to improve a degree of integration and performance of a flash memory device.

A structure of a vertical-type TCAT flash memory cell string for improving the degree of integration is disclosed in "Vertical Cell Array Using TCAT (Tera Cell Array Transistor) Technology for Ultra High Density NAND Flash Memory" (Jaehoon Jang, et al., 2009 Symposium on VLSI Technology Digest of Technical Papers, pp. 192-193) (referred to as Non-Patent Document 1).

FIGS. 3A and 3B are cross-sectional diagrams illustrating a vertical-type TCAT flash memory cell string in X and Y directions disclosed in Non-Patent Document 1. FIGS. 4A and 4B are graphs illustrating a voltage (control gate voltage Vg)—current (bit line current $I_{BL}$) characteristic of the cell string and a distribution of threshold voltage (Vth) with respect to 32 cells of string. In FIGS. 3A and 3B, the aforementioned TCAT flash memory cell string includes a channel region which is formed in the vertical direction on a semiconductor substrate formed as a p-substrate, cell string which includes a plurality of cell devices which are formed in series to be electrically separated from each other and is formed at the side surface of the channel region, and an n+ region which is formed on the semiconductor substrate. The upper portion of the channel region is connected to bit lines BL, and gate electrodes of the cell devices are connected to word lines WL. As illustrated in FIG. 4B, the distribution of the threshold voltage of each cell device in the above-described TCAT flash memory cell string is as wide as 1 V or more.

In addition, a 3D NAND flash memory device having a dual-channel structure is disclosed in "A Novel Dual-Channel 3D NAND Flash Featuring both N-Channel and P-Channel NAND Characteristics for Bit-alterable Flash Memory and A New Opportunity in Sensing the Stored Charge in the WL Space" (Hang-Ting Lue, et al., 2013 IEEE pp. 3.7.1-3.7.4) (referred to as Non-Patent Document 2).

FIGS. 5A and 5B are conceptual diagrams illustrating the 3D NAND flash memory having a dual-gate structure disclosed in Non-Patent Document 2. FIG. 6 is a graph illustrating an Id-Vg characteristic curve of the flash memory.

In the flash memory devices in the related art illustrated in FIGS. 3A and 3B and FIGS. 5A and 5B, the slope is low in the range (sub-threshold) of lower than the threshold voltage Vth, and thus, the distribution of the threshold voltage Vth is wide. As a result, a refresh margin cannot be increased. By increasing the refresh margin, a read time can be shortened. In the range of less than the threshold voltage Vth, the slope of the I-V characteristic curve is as high as about 250 mV/dec. Because the slope of the I-V characteristic curve is very high in the gate structure of FIGS. 3A and 3B where a tubular channel and a gate insulating film stack formed thereon are surrounded and the dual-gate structure of FIGS. 5A and 5B, the distribution of the threshold voltage can be greatly increased. In particular, in the case where the slope in the sub-threshold range is deteriorated due to an increase in program/erase cycle or the like, the distribution of the threshold voltage can be more greatly increased.

SUMMARY OF THE INVENTION

The invention is to provide a reading method having the steep switching characteristics for a cell string by using positive feedback.

According to an aspect of the invention, there is provided a reading method for the cell string having n control electrodes formed on a semiconductor body, a gate insulating film stack formed between the semiconductor body and the control electrodes, and first and second semiconductor regions formed at respective ends of the semiconductor body, in a state where the n control electrodes are connected to respective n word lines WL[0] to WL[n-1], the first semiconductor region is connected to a bit line BL, and the second semiconductor region is connected to a common source line CSL, the reading method comprising at least a step (r1) of, when a selected word line is the word line WL[k] (0<k<n-1), applying sequentially a voltage which is lower than a read voltage ($V_{verify}$) and the read voltage ($V_{verify}$) to the selected word line WL[k], applying a pass voltage to the word lines WL[n-1] to WL[k+1], applying the pass voltage to at least one or more of the word lines adjacent to the word line WL[k] among cell devices which are on lower than the word line WL[k] and applying a voltage having an opposite polarity of the pass voltage to the remaining word lines, thereby reading information stored in the selected word line WL[k].

In the above aspect, preferably, in a state where the cell string further includes a first selection device SD-1 and a second selection device SD-2 which are formed at respective ends of the n control electrodes, the first selection device SD-1 is connected to a first string selection line SL[1] and the second selection device SD-2 is connected to a second string selection line SL[2], in the step (r1), SL[1] is applied with a third voltage to electrically connect a word line cell adjacent to the first selection device SD-1 and the bit line BL, and SL[2] is applied with a fourth voltage to maintain a state which a word line cell adjacent to the selection device SD-2 is electrically connected to the common source line CSL.

In the above aspect, preferably, in the step (r1), the common source line CSL and unselected bit lines are applied with a second voltage and the selected bit lines are applied with a first voltage lower than the second voltage, so that a current can flow in a selected cell string and no current flows in the unselected bit lines in a read operation.

In the above aspect, preferably, before the step (r1), the reading method further comprises a step (r0) of, when a selected word line is the word line WL[k] (0<k<n-1), applying the pass voltage to the word lines WL[n-1] to WL[k], applying the pass voltage to at least one or more of word lines adjacent to the word line WL[k] among cell devices which are on lower than the word line WL[k], applying a voltage having an opposite polarity of the pass voltage to the remaining word lines, and applying the first voltage to the selected bit line, unselected bit lines and CSL.

In the above aspect, preferably, in the step (r1), in case of performing sensing all the bit lines, the common source line CSL is applied with the second voltage and all the bit lines of a selected page are applied with a voltage which is lower than the second voltage, so that a current can flow in all the cell strings of the selected page.

In the above aspect, preferably, in a state where the cell string further includes dummy cells at both or any one of respective ends of the n word line cells (WL[0] cell to WL[n-1] cell) in the cell string, in the step (r1), in case the dummy cell is at the upper region of the selected word line cell (WL[k] cell), the dummy cell is applied with the pass voltage.

In the above aspect, preferably, in a state where the cell string further includes dummy cells at both or any one of respective ends of the n word line cells (WL[0] cell to WL[n-1] cell) in the cell string, in the step (r1), in case the dummy cell is at the lower of the selected word line cell (WL[k] cell), if the selected word line is the least significant word line, the dummy cell is applied with the pass voltage, and if not, the dummy cell is applied with a voltage having an opposite polarity of the pass voltage.

In the above aspect, preferably, in the step (r1), the pass voltage applied to the word lines WL[n-1] to WL [k+1] and the pass voltage applied to at least one or more word lines which are on lower than the word line WL[k] have a same polarity and a different magnitude to each other.

According to another aspect of the invention, there is provided a reading method for a cell string having n control electrodes formed on a semiconductor body, a gate insulating film stack formed between the semiconductor body and the control electrodes, first and second semiconductor regions formed at respective ends of the semiconductor body, and a first selection device SD-1 and a second selection device SD-2 which are formed at respective ends of the control electrodes, in a state where the n control electrodes of the cell string are connected to n word lines WL[0] to WL[n-1], respectively, the first semiconductor region is connected to a bit line BL, the second semiconductor region is connected to a common source line CSL, the first selection device SD-1 is connected to a first string selection line SL[1] and the second selection device SD-2 is connected to a second string selection line SL[2], the reading method comprising at least steps of: (m1) applying a pass voltage having a same polarity to all the word lines except for the selected word line WL[k] in the cell string, turning on any one of the selection line SL[1] and the selection line SL[2], applying a first voltage which is lower than the read voltage ($V_{verify}$) to the selected word line WL[k], and applying a second voltage to all the bit lines and the common source line CSL; and (m2) applying a third voltage to the common source line CSL and unselected bit lines, applying the read voltage ($V_{verify}$) to the selected word line WL[k], and turning on both of the selection line SL[1] and the selection line SL[2] to perform a read operation, thereby reading information stored in the selected word line WL[k].

The reading method for a cell string according to the invention would have applied to a cell string including a plurality of control electrodes formed on a semiconductor body, a gate insulating film stack formed between the semiconductor body and the control electrodes, first and second semiconductor regions formed at respective ends of the semiconductor body, and a first selection device SD-1 and a second selection device SD-2 which are formed at respective ends of the control electrodes.

By applying the reading method of the present invention to the cell string, when a control electrode voltage of a turn-on voltage or more is applied to a certain selected cell, due to positive feedback, switching of current rapidly occurs, so that very good switching characteristic is obtained. As a result, a distribution of turn-on voltage can be improved. Due to the steep switching characteristics, the variability of the read current of the cell is reduced and thus the error is greatly reduced in the read operation in relation to the conventional reading method.

In addition, due to a very high slope of an I-V characteristic curve, a refresh margin can be improved, and thus, a read time and a verify time can be shortened.

In addition, due to the very steep slope of the I-V characteristic curve, a program time may be shortened.

Lastly, when the times of the programming operation and the erasing operation are increased, a change of the threshold voltage according to the conventional reading method for NAND flash memory is greatly generated, but the reading method according to the present invention has a low change of a turn-on voltage.

DETAILED DESCRIPTION OF THE PREFERRED EMBODIMENTS

In a reading method for a cell string according to the present invention, predetermined voltages are applied to cell string selection devices, a selected cell device, and unselected cell devices, so that positive feedback occurs. As a result, at a specific control electrode voltage of the selected cell device, a current is greatly increased, so that switching occurs. Therefore, the reading method according to the present invention provides a switching characteristic having a steep slope which is close to verticality. A distribution of voltage where the switching occurs is greatly decreased in comparison with a distribution of threshold voltage in a NAND flash memory in the related art, so that a good refresh margin is obtained.

First of all, a structure of a cell string which the reading method according to the invention can be applied to will be described in detail. The reading method according to the present invention can be applied to the cell strings having various structures. The cell strings includes a semiconductor body which is formed on a insulating layer and is functioned as a channel, n control electrodes formed on the semiconductor body, a gate insulating film stack formed between the semiconductor body and the control electrodes, first and second semiconductor regions formed at respective ends of the semiconductor body, and a first selection device SD-1 and a second selection device SD-2 which are formed at respective ends of the control electrodes.

Figure 3A:
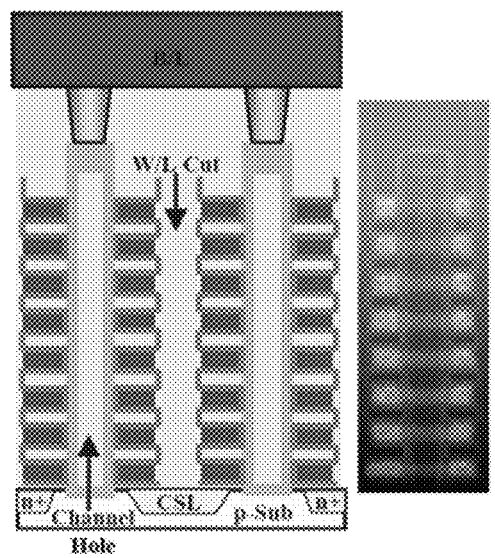
FIGS. 3A and 3B are cross-sectional diagrams illustrating a vertical-type TCAT flash memory cell string in X and Y directions disclosed in Non-Patent Document 1.
Figure 3B:
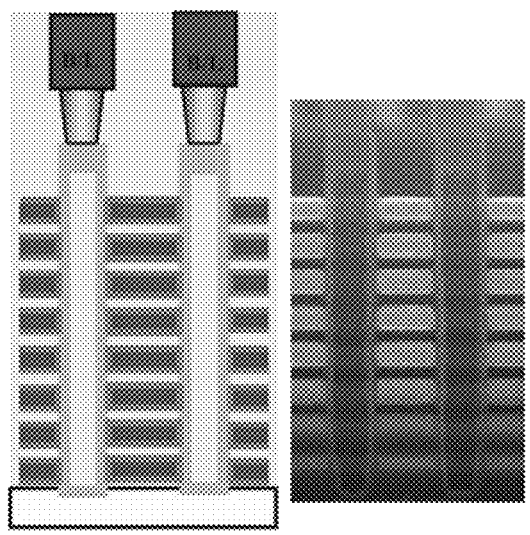
Figure 4A:
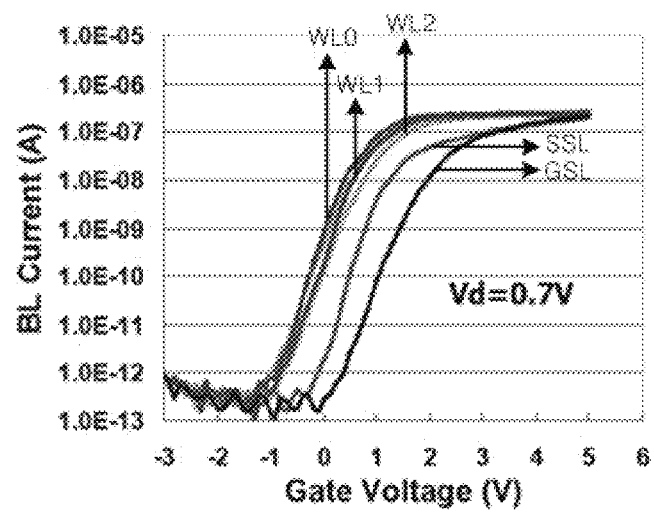
FIGS. 4A and 4B are graphs illustrating a voltage (control gate voltage Vg)—current (bit line current $I_{BL}$) characteristic curve of the cell string and a distribution of threshold voltage with respect to 32 cells of a string.
Figure 4B:
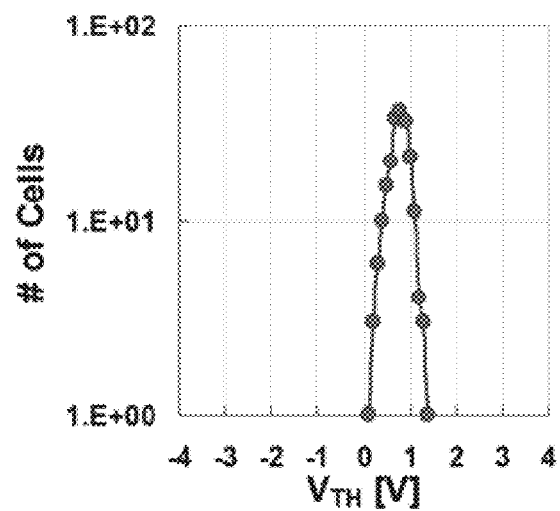
Figure 5A:
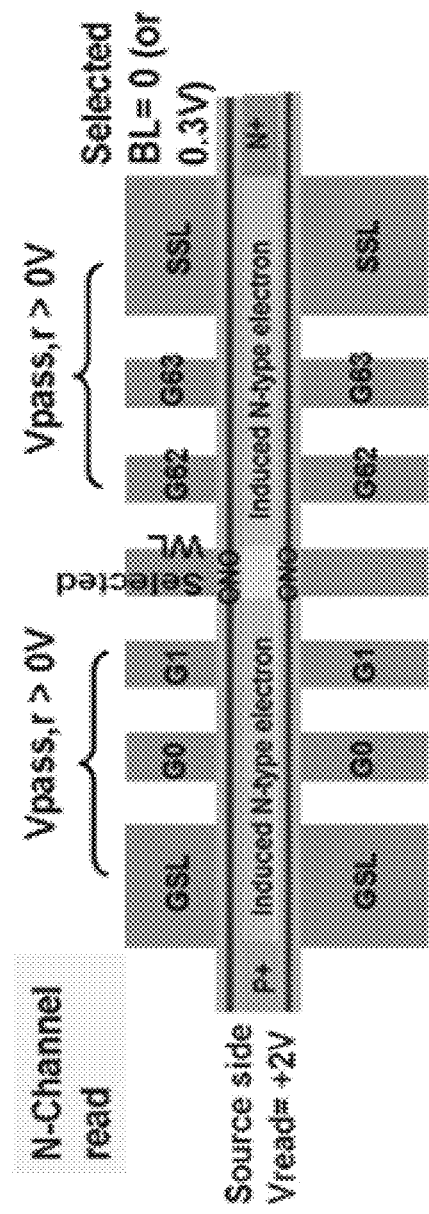
FIGS. 5A and 5B are conceptual diagrams illustrating a 3D NAND flash memory having a dual-gate structure disclosed in Non-Patent Document 2.
Figure 5B:
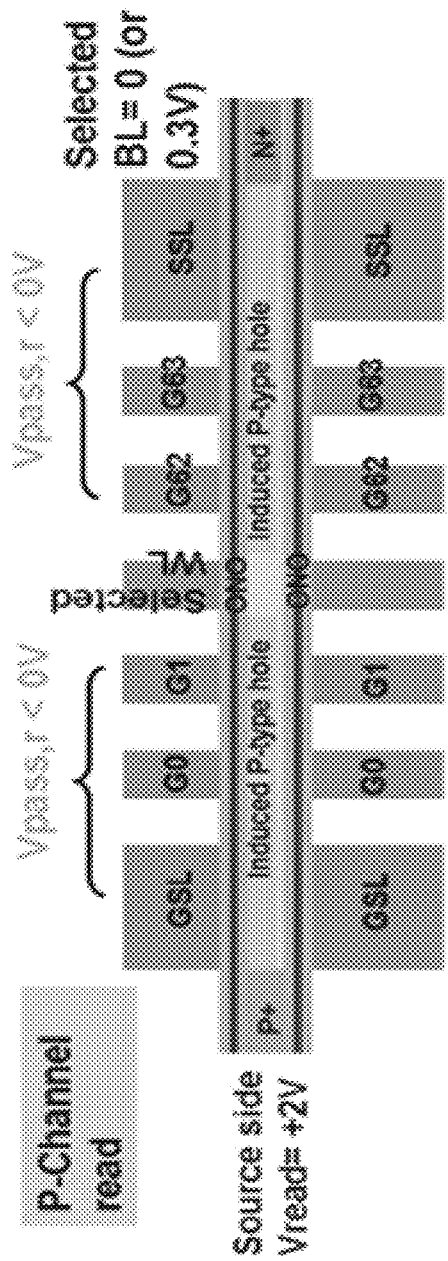
Figure 6:
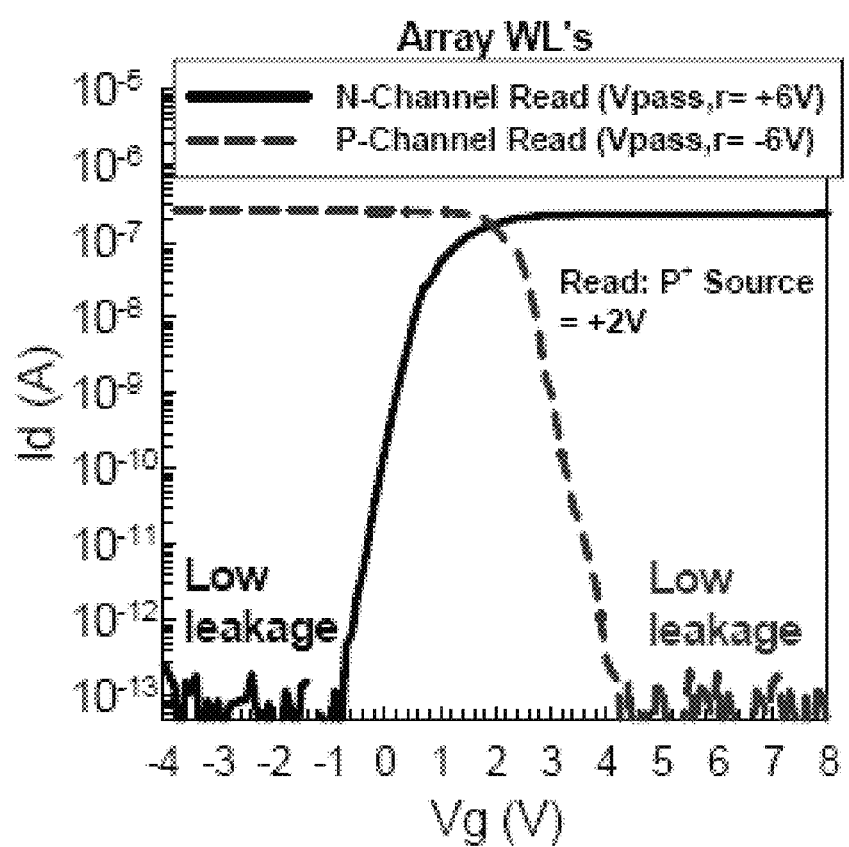
FIG. 6 is a graph illustrating an Id-Vg characteristic curve of the flash memory in FIGS. 5A and 5B.
Figure 7A:
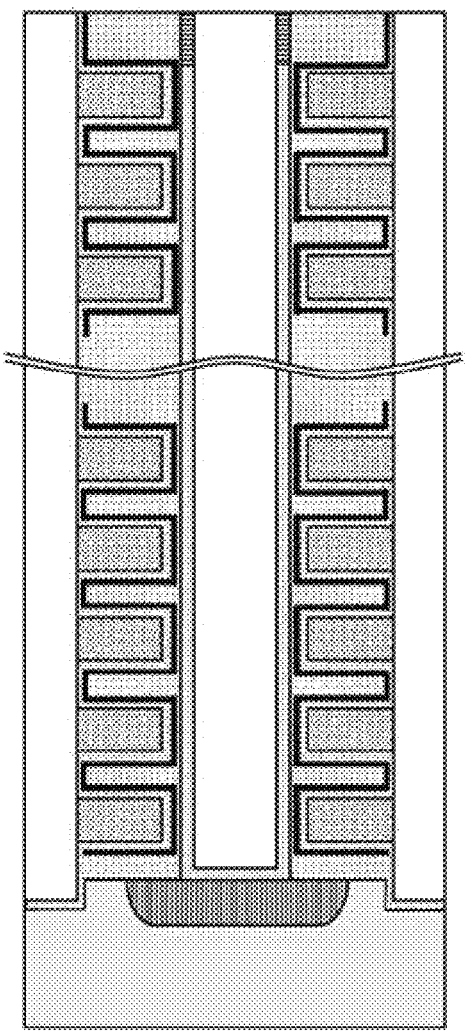
FIGS. 7A and 7B are a cross-sectional diagram and a circuit diagram illustrating an example of a cell string which the reading method of the present invention would be applied and which have a vertical structure based on a diode.
Figure 7B:
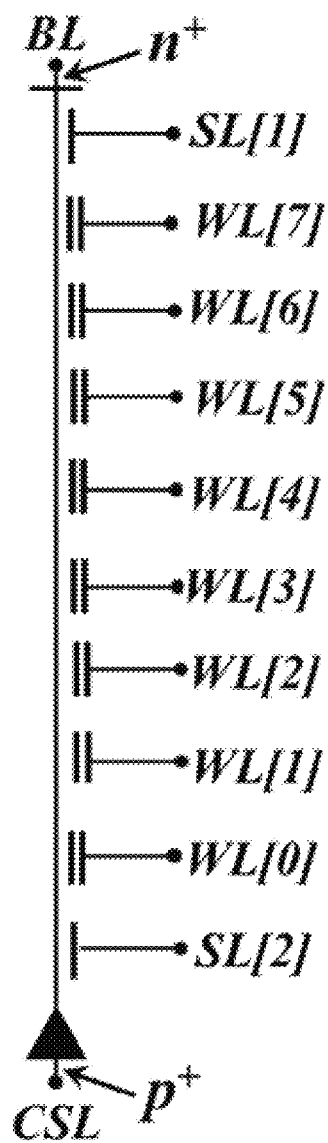
Figure 8A:
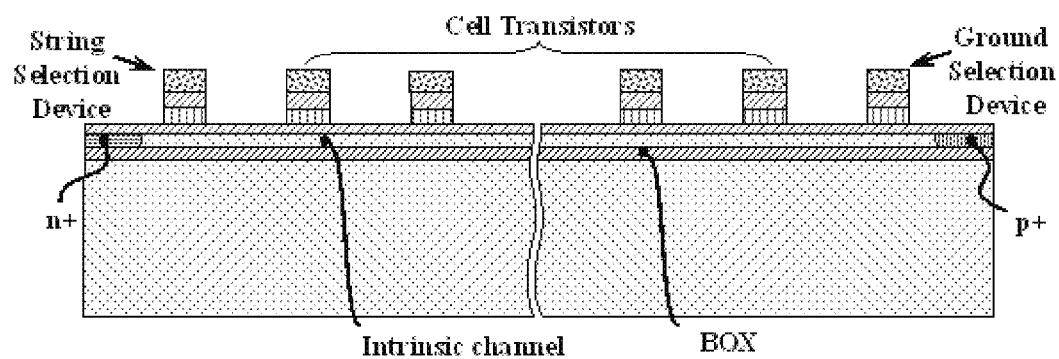
FIGS. 8A and 8B are a cross-sectional diagram and a circuit diagram illustrating another example of a cell string which the reading method of the present invention would be applied and which have a horizontal structure based on a diode.
Figure 8B:
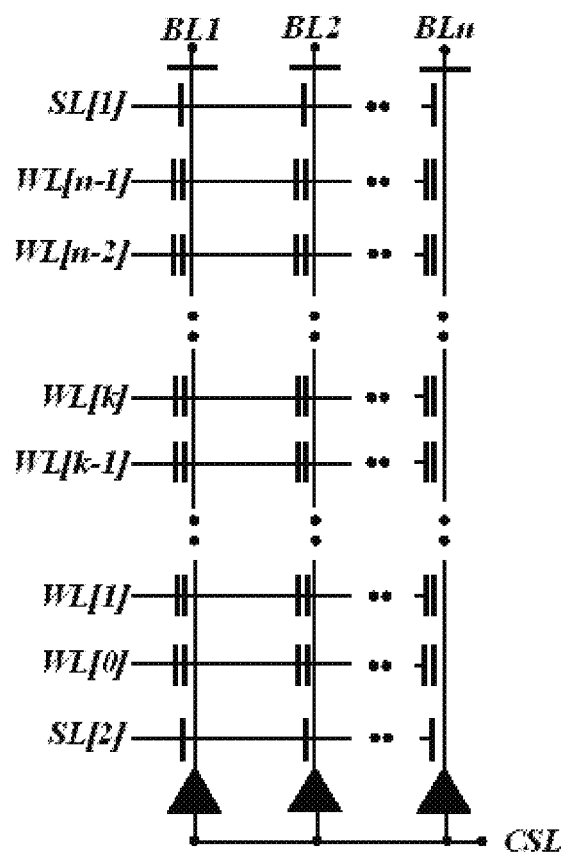

FIGS. 3A, 3B, 5A, 5B, 7A and 8A are cross-sectional diagrams illustrating the cell strings which the reading method according to the present invention can be applied to. Referring to FIGS. 5A, 5B and 7A, the reading method according to the present invention can be applied to the case where the cell string is formed in the vertical direction. Referring to FIGS. 3A and 3B, the reading method according to the present invention can be applied to the case where the cell string is formed in the horizontal direction. Additionally, Referring to FIGS. 3A and 3B, the reading method according to the present invention can be applied to the case where Flash memory cell string is configured to include first and second semiconductor regions of which the impurity types are same to each other to be operated as a MOSFET. Furthermore, referring to FIGS. 7A and 8A, the reading method according to the present invention can be applied to the case where Flash memory cell string is configured to include first and second semiconductor regions of which the impurity types are different to each other to be operated as a diode.

The reading method according to the present invention can be applied to the above described cell strings in a state where the n control electrodes of the cell string are connected to n word lines WL[0] to WL[n-1], respectively, the first semiconductor region is connected to a bit line BL, the second semiconductor region is connected to a common source line CSL, the first selection device SD-1 is connected to a first string selection line SL[1] and the second selection device SD-2 is connected to a second string selection line SL[2].

The First Embodiment

Figure 1:
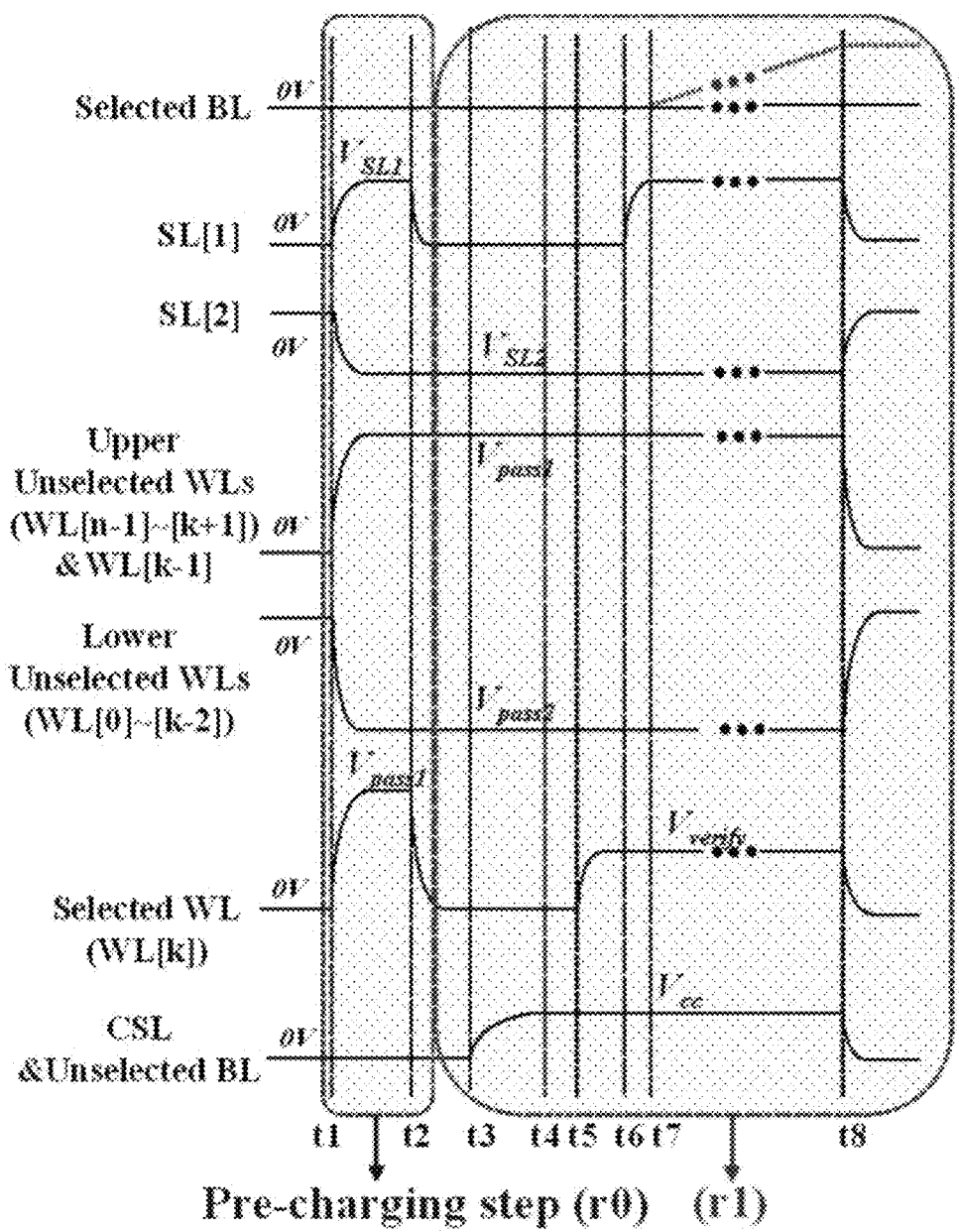
FIG. 1 is a graph illustrating states of bias applied to lines of a cell string for explaining a reading method for a cell string according to a first embodiment of the present invention.

Hereinafter, referring to FIGS. 1, 9, 10, 11A to 11E, 12 and 13, the reading method according to a first embodiment of the invention will be described in detail. FIG. 1 is a graph illustrating states of bias applied to lines of a cell string for explaining the reading method for a cell string according to a first embodiment of the present invention. FIGS. 11A to 11E are energy band diagrams at steps t2, t3, t4, t6, and t7 of FIG. 1.

The reading method for a cell string according to the first embodiment of the invention includes a pre-charging step and a reading step. The pre-charging step may not be included. However, in terms of durability, it is preferable that the pre-charging step be included. The reading method according to the invention denotes a general read operation or denotes a verify operation after programming or erasing operation.

Referring FIG. 1, the reading method for the cell string according to the invention includes a pre-charging step (r0) and a reading step (r1) for reading a selected word line cell (WL[k] cell). Herein, one cell string includes n word lines (WL[0] to WL[n-1]) and two selection devices SD1 and SD-2. In this specification, for a convenient explanation, the word line WL[0] represents the least significant word line and the word line WL[n-1] represents the most significant word line.

In the pre-charging step, a positive turn-on voltage $V_{SL1}$ and a negative turn-on voltage $V_{SL2}$ are applied to the string selection lines SL[1] and SL[2], respectively; a positive pass voltage ($V_{pass1}$) is applied to the selected word line WL[k], the upper word lines (Upper WL) of the selected word line (WL[k]), at least one or more of the lower word line adjacent to the selected word line (WL[k]); and a negative pass voltage ($V_{pass2}$) is applied to the remaining lower word lines (Lower WL). As a result, electrons and holes are supplied from the bit line BL and the common source line CSL to the channel.

Herein, the lower word lines to which the positive pass voltage is applied are the word lines adjacent to the selected word line, have to include the word line WL[k−1] and alternatively include the adjacent lower word lines. Hereinafter, in this specification, for convenient explanation, the lower word line to which the positive pass voltage is applied is represented as WL[k−1]. However it does not limit the scope of the invention.

Figure 11A:
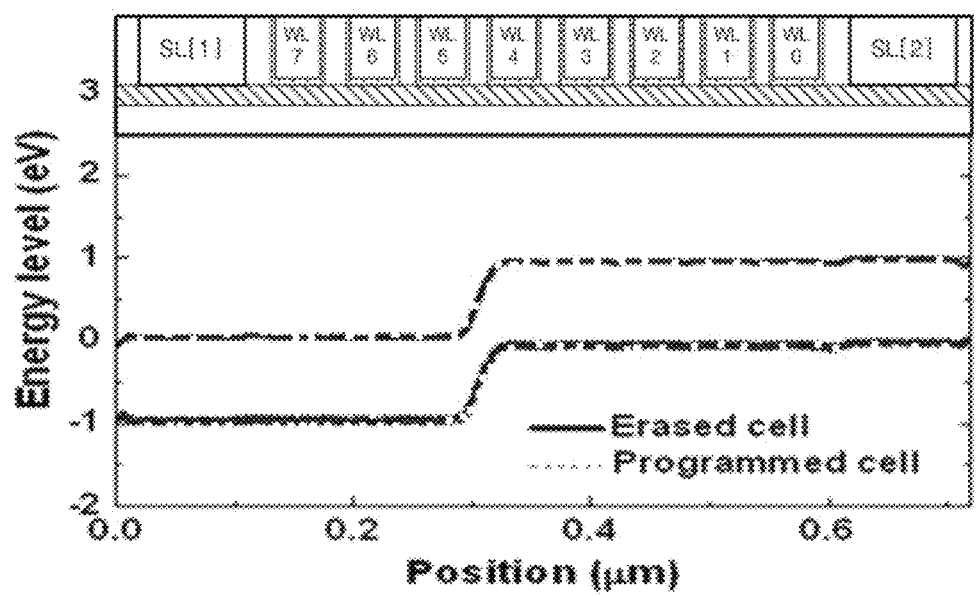
FIGS. 11A to 11E are energy band diagrams at steps t2, t3, t4, t6, and t7 of FIG. 1.

Namely, as illustrated in FIG. 11A, in the period of t1 to t2, by applying the positive turn-on voltage and the positive pass voltage to the selection line SL[1] and the upper word lines WL[n-1] to WL[k−1], respectively, the electrons are supplied from the bit lines to the channel of the cell string; and by applying the negative turn-on voltage and the negative pass voltage to the selection line SL[2] and the lower word lines WL[k−2] to WL[0], respectively, the holes are supplied from the common source line CSL to the channel of the cell string. The above-described voltage bias is preferred. Alternatively, the word lines WL[n-1] to WL[k−2] or the word line WL[k−3] may also be applied with the positive pass voltage to be operated. As the number of word lines applied with the positive pass voltage is increased, the diffusion length of the holes which are to be diffused from the channel in the cell string may be increased.

Figure 11B:
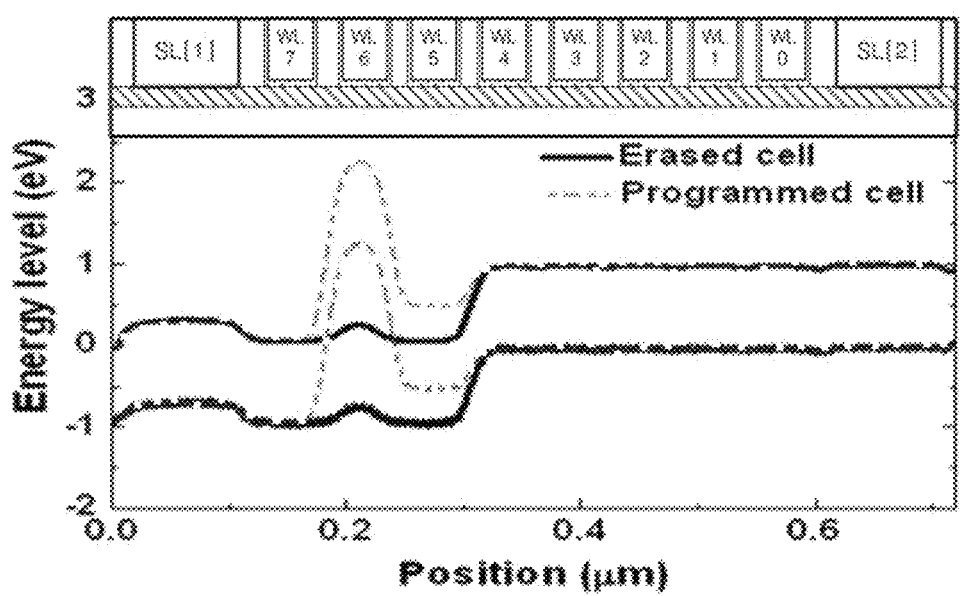
Figure 11C:
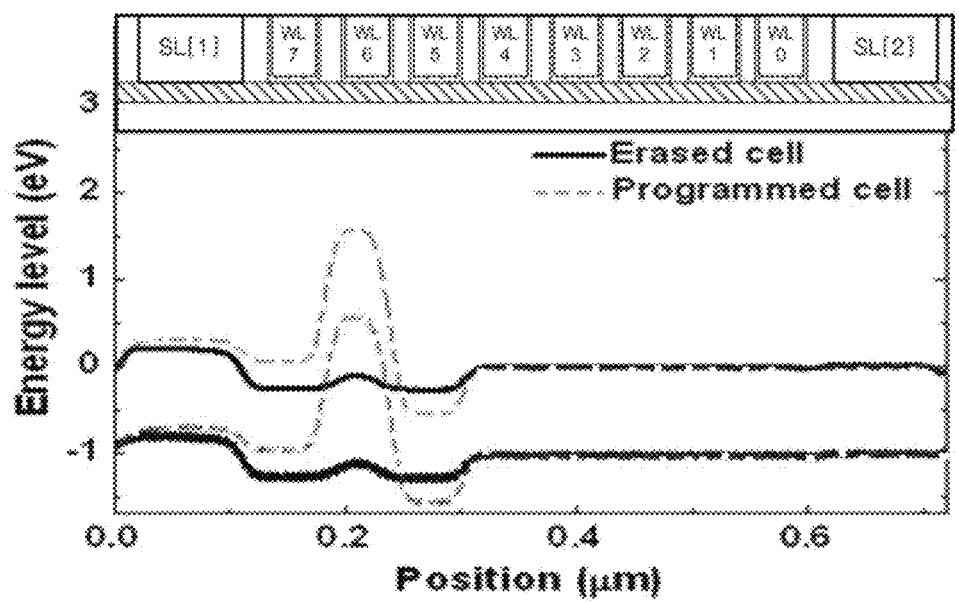
Figure 11D:
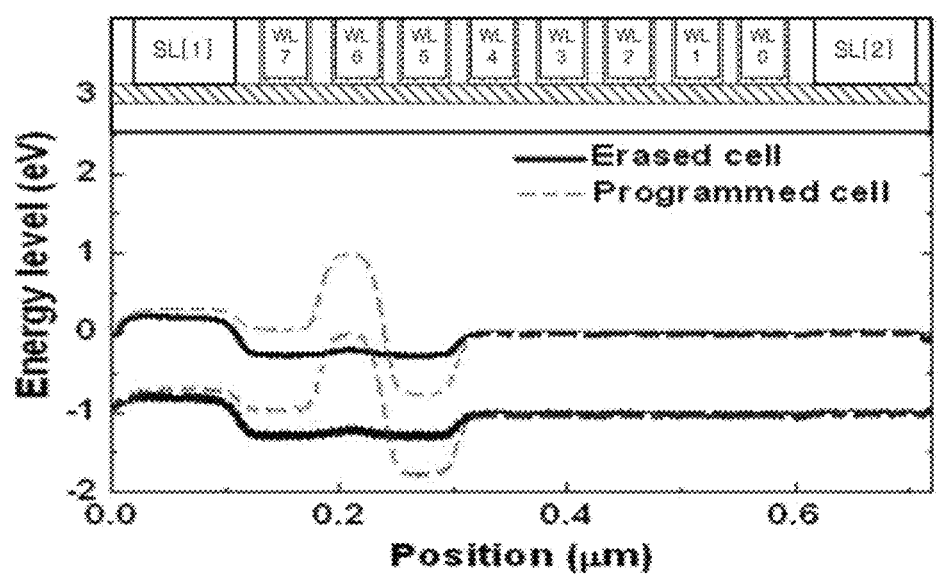
Figure 11E:
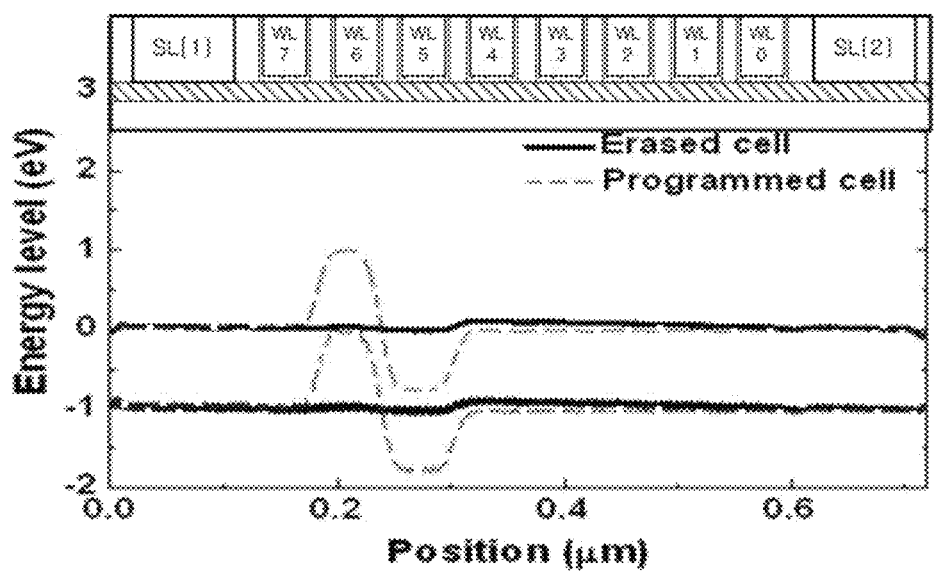

The process of the reading step will be described more in detail with reference to FIGS. 1, 11B to 11E. First, as illustrated in FIG. 11B, in the period of t2 to t3, in order to charge a CSL node, a turn-off voltage and a voltage (for example, 0 V) lower than the read voltage $V_{verify}$ are applied to the selection line SL[1] and the selected word line WL[k], respectively. Next, as illustrated in FIG. 11C, in the period of t3 to t4, the CSL node and the unselected bit lines BLs are charged with $V_{cc}$, no current flows. This operation can be effectively applied so as to distinguish the even bit lines BLs and the odd bit lines BLs in reading. In case of sensing all the bit lines BLs, there is no need to distinguish the selected bit line BL and the unselected bit lines BLs. Next, as illustrated in FIG. 11D, in the period of t5 to t6, the read voltage $V_{verify}$ is applied to the selected word line WL[k]. Next, as illustrated in FIG. 11E, in the period of t6 to t7, the turn-on voltage is applied to the selection line SL[1], and the read operation (verify) is started.

Figure 12:
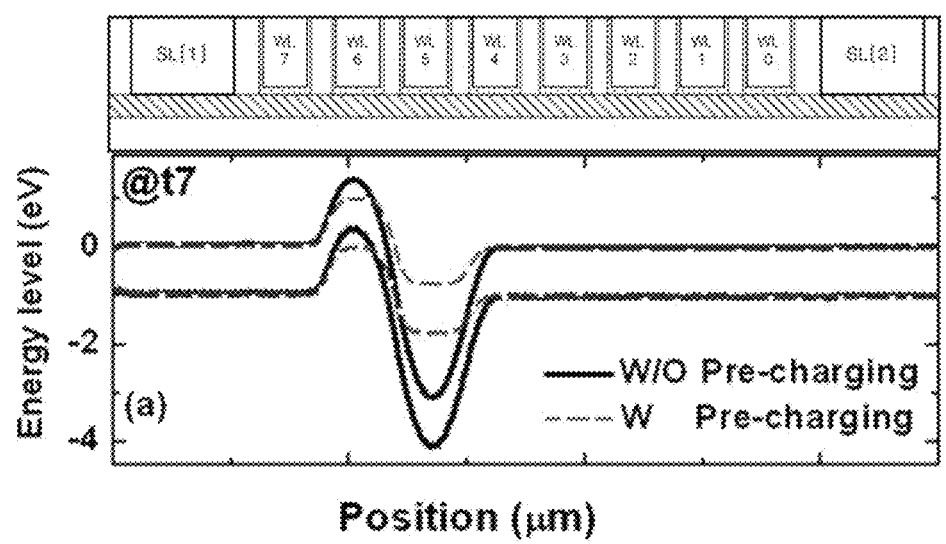
FIG. 12 is a graph illustrating a difference in the energy band diagram according to the presence and absence of a pre-charging step for a portion of channel of the cell string in the reading method according to the first embodiment of the invention.
Figure 13:
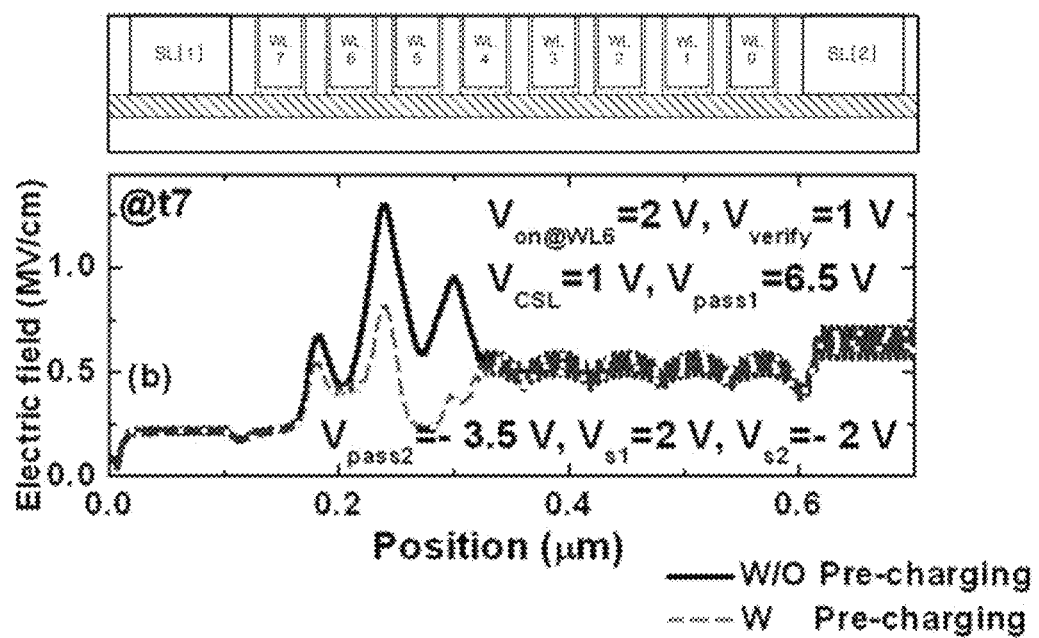
FIG. 13 is a graph illustrating a difference in electric field according to the presence and absence of a pre-charging step for a portion of channel of the cell string in the reading method according to the first embodiment of the invention.

FIGS. 12 and 13 are graphs illustrating a difference in the energy band diagram and a difference in electric field according to the presence and absence of the pre-charging step in the reading method for the cell string according to the first embodiment of the invention.

As described above, the reading method for the cell string according to the first embodiment of the invention includes the pre-charging step and the reading step. Herein, the pre-charging step may be selectively included. In case the pre-charging step is not included, the potential of the channel of a pass cell (herein, the WL[5] cell) is boosted by the pass voltage, a high electric field is generated. Therefore, hot carriers are generated, so that the pass cell and peripheral pass cells may be deteriorated. However, as illustrated in FIG. 13, in the read operation, the electrons and holes are supplied to the channel by the pre-charging step, so that the potential of the channel of the pass cell WL[5] is not boosted, and the electric field can be greatly decreased.

Figure 9:
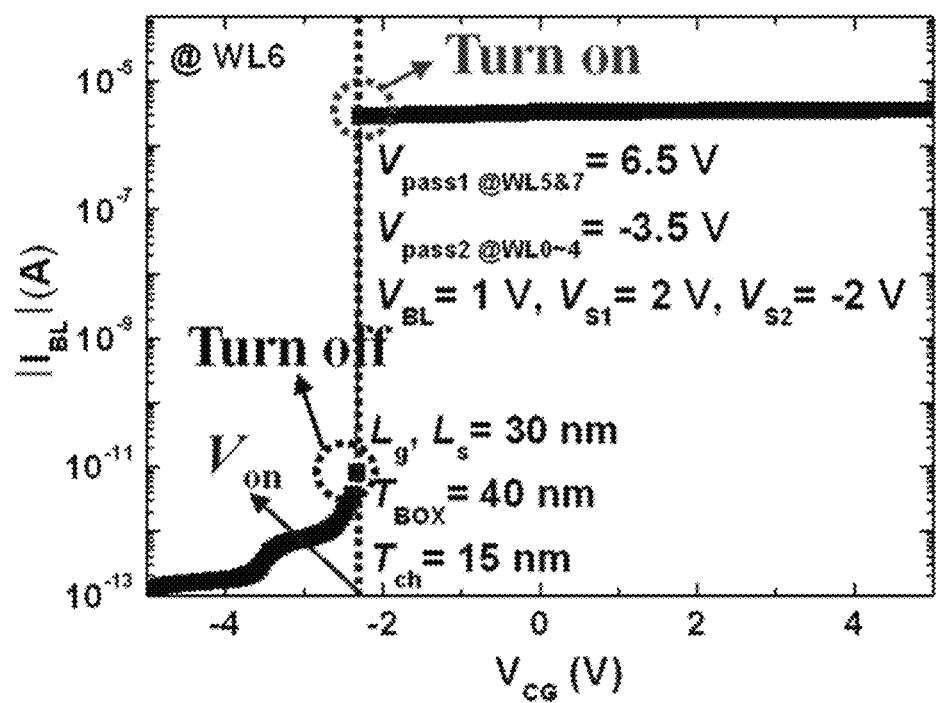
FIG. 9 is a graph illustrating a current ($I_{BL}$: bit line current)-voltage ($V_{CG}$: voltage applied to a control electrode of a selected WL cell) characteristic curve in the selected cell in the reading method according to the embodiments of the invention.

In the case of using the reading method for the cell string according to the invention, as illustrated in FIG. 9, very good switching characteristic is achieved, so that the device characteristics are improved.

Meanwhile, the cell string to which the reading method according to the invention is applied would include a dummy cell at both or any one of ends in the cell string. The reason why the cell string further includes dummy cell at both or any one of ends of the cell string is as follows. There are problems that the cells being at the ends of a cell string have commonly many changes of cell characteristics including a distribution of threshold voltage due to a lot of variation in the manufacturing process. Therefore, the problems can be solved by adding the dummy cells to the ends of the cell string. The dummy cells are used effectively in the reading method for the cell string according to the invention when the word line cell (WL[0] cell) of the cell string is read. For example, the dummy cell connected to the word line cell (WL[0] cell) functions as a word line cell (WL[0-1] cell). Herein, the 'k' is zero.

Hereinafter, in case of including the dummy cells at both or any one of n word line cells (WL[0] cell to WL[n-1] cell) in a cell string, the voltage applied to the dummy cell in the reading method according to the invention will be described in detail.

Referring to FIG. 1, in the reading step (r1), in a state where the dummy cell is at the upper region of the selected word line cell (WL[k] cell), it is preferable that the corresponding dummy cell is applied with a pass voltage.

In addition, in the reading step (r1) of FIG. 1, in a state where the dummy cell is at the lower region of the selected word line cell (WL[k] cell), it is preferable that if the selected word line is the least significant word line (that is, k=0), the corresponding dummy cell is applied with a pass voltage, if not (that is, k≠0), the corresponding dummy cell is applied with a voltage having an opposite polarity of the pass voltage.

Therefore, when the selected word line is WL[0](that is, k=0), the dummy cell connected to the word line cell (WL[0] cell) is able to function as a word line cell (WL[k−1] cell), thereby the dummy cell is used effectively.

The Second Embodiment

Figure 2:
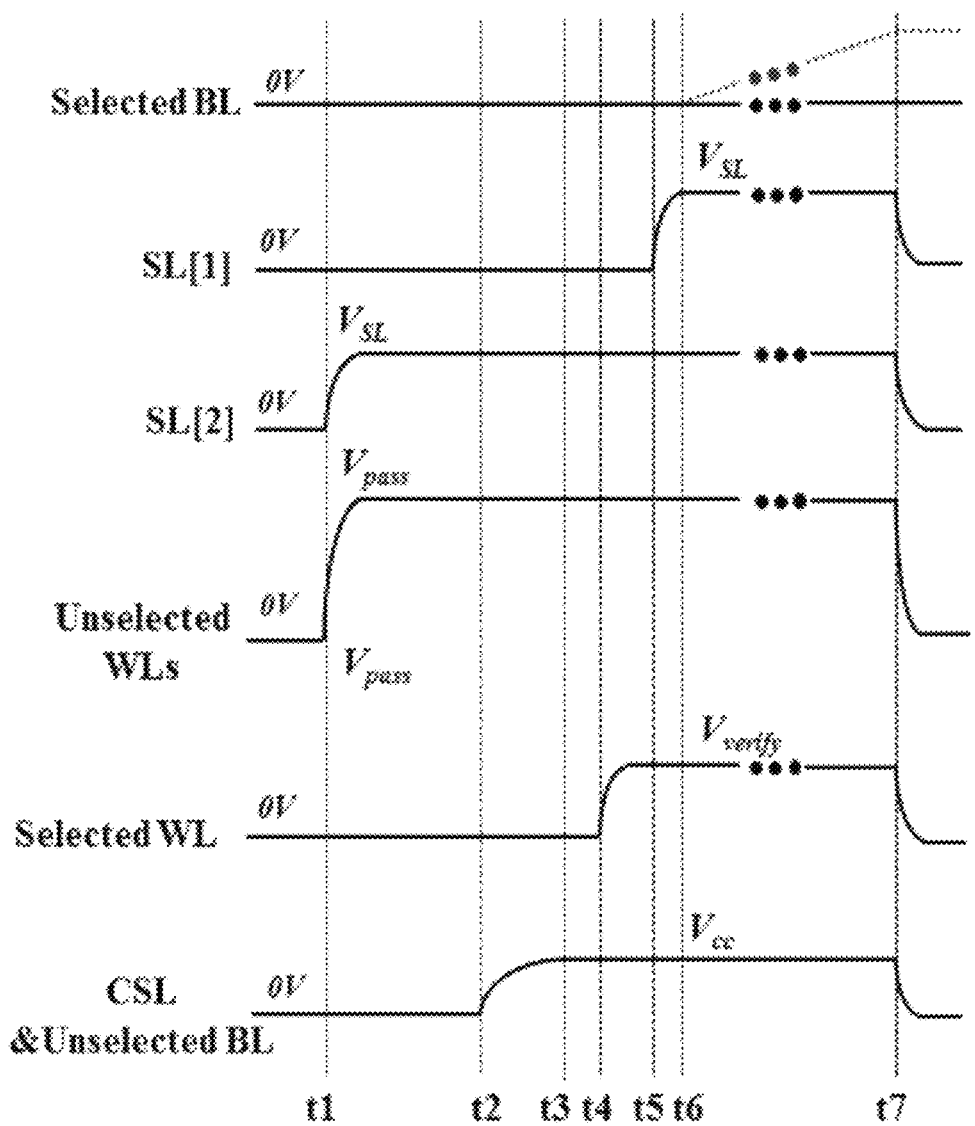
FIG. 2 is a graph illustrating states of bias applied to lines of a cell string for explaining a reading method for a cell string according to a second embodiment of the present invention.

FIG. 2 is a graph illustrating states of bias applied to lines of a cell string for explaining the reading method for a cell string according to a second embodiment of the present invention.

Referring to FIG. 2, the reading method according to the second embodiment of the invention will be described in detail.

The reading method for a cell string according to this embodiment of the invention includes the steps of; (m1) applying a pass voltage having a same polarity to all the word lines except for the selected word line WL[k] in the cell string, turning on any one of the selection line SL[1] and the selection line SL[2], applying a voltage which is lower than the read voltage ($V_{verify}$) to the selected word line WL[k], and applying a voltage to all the bit lines and the common source line CSL, and (m2) of applying a voltage to the common source line CSL and unselected bit lines, applying the read voltage ($V_{verify}$) to the selected word line WL[k], and turning on both of the selection line SL[1] and the selection line SL[2] to perform a read operation, thereby reading information stored in the selected word line WL[k].

FIG. 9 is a graph illustrating a current ($I_{BL}$: bit line current)-voltage ($V_{CG}$: voltage applied to a control electrode of a selected WL cell) characteristic curve of a cell string having one of the above-described structures according to the embodiments of the invention. Referring to FIG. 9, when a predetermined voltage is applied, a turn-on current flows rapidly, so that the cell string is switched steeply from a turn-off state to a turn-on state. This phenomenon occurs due to positive feedback in the read operations of the flash memory cell string according to the invention. This will be described more in detail with reference to FIG. 10.

Figure 10:
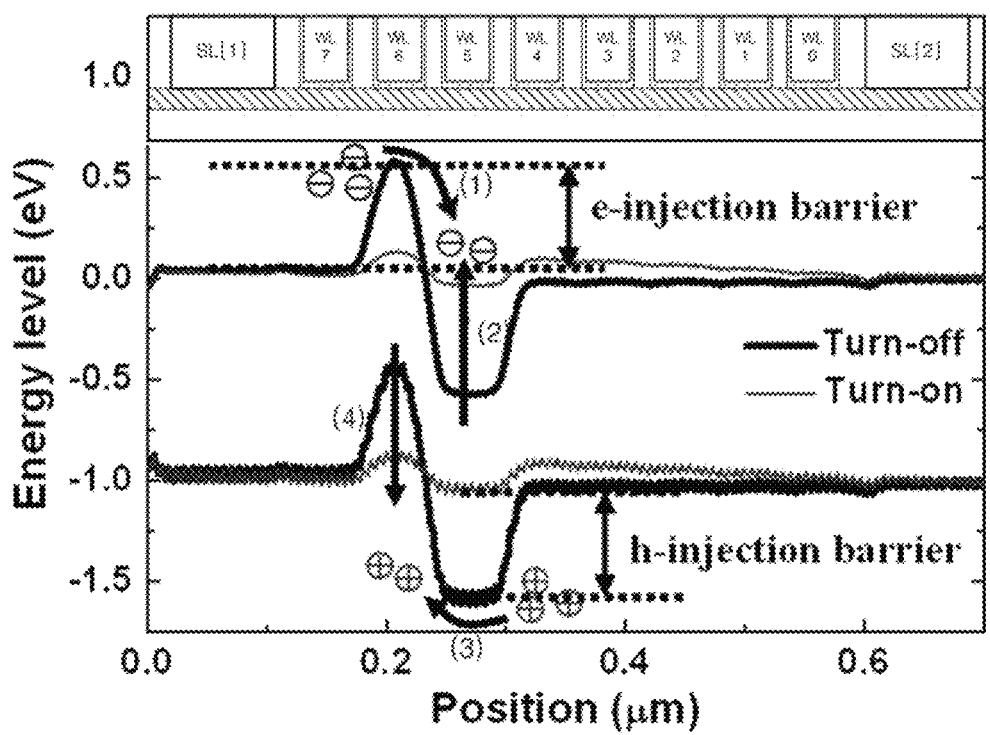
FIG. 10 is an energy band diagram for explaining a read mechanism using positive feedback in the reading method according to the embodiments of the invention.

FIG. 10 is an energy band diagram for explaining a read mechanism using positive feedback in read and verify operations according to the embodiments of the invention. As an example, the read mechanism of reading information stored in the selected WL[k] cell (for example, the WL[6] cell) will be described with reference to FIG. 10.

In FIG. 10, the x axis denotes a vertical position of the semiconductor body, and the y axis denotes an energy level at the vertical position. In the turn-off state, due to a high potential barrier, electrons and holes cannot flow as indicated by solid lines. When a certain number of charges are supplied to the floating channel of the WL[k−1] cell (=WL[5] cell) as indicated by (1), the potential of the floating channel is increased as indicated by (2). Therefore, the potential barrier of the floating channel of the WL[5] cell is lowered as indicated by (3), holes are diffused into the channel of the selected WL[6] cell. As indicated by (4), the holes supplied in this manner decreases the potential (potential barrier with respect to the electrons) of the channel of the selected WL[6] cell, so that the number of electrons which flow into the floating channel of the WL[5] cell is greatly increased. Due to the positive feedback of (1)→(2)→(3)→(4), the current is greatly increased, the cell string is switched from the turn-off state to the turn-on state with a very steep slope.

While the present invention has been particularly shown and described with reference to exemplary embodiments thereof, it will be understood by those skilled in the art that various changes and modifications in form and details may be made therein without departing from the spirit and scope of the present invention as defined by the appended claims.

What is claimed is:

1. A reading method for a cell string using multiple pass voltages, the cell string having n number of control electrodes formed on a semiconductor body (n: an integer), a gate insulating film stack formed between the semiconductor body and the control electrodes, and first and second semiconductor regions formed at respective ends of the semiconductor body, in a state where the n number of control electrodes are connected to n number of word lines (WL[0] to WL[n−1]), respectively, the first semiconductor region is connected to a bit line BL, and the second semiconductor region is connected to a common source line CSL, when a selected word line is a word line WL[k] (0<k<n−1), the reading method comprising steps (r1) of:

applying sequentially a predetermined voltage and a read voltage ($V_{verify}$) higher than the predetermined voltage to the selected word line WL[k], applying a pass voltage to upper word lines defined by word lines (WL[k+1] to WL[n−1]);

applying the pass voltage to at least one word line adjacent to the selected word line WL[k] among lower word lines defined by word lines (WL[0] to WL[k−1]); and applying a first voltage having an opposite polarity to the pass voltage to the lower word lines except for the at least one word line, thereby reading information stored in the selected word line WL[k].

2. The reading method according to claim 1, in a state where the cell string further includes a first selection device SD-1 and a second selection device SD-2 which are formed at respective ends of the control electrodes, the first selection device SD-1 is connected to a first string selection line SL[1] and the second selection device SD-2 is connected to a second string selection line SL[2], wherein in the steps (r1), the first string selection line SL[1] is applied with a third voltage to electrically connect a word line cell adjacent to the first selection device SD-1 and the bit line BL, and the second string selection line SL[2] is applied with a fourth voltage to maintain a state where a word line cell adjacent to the second selection device SD-2 is electrically connected to the common source line CSL.

3. The reading method according to claim 1, wherein in the steps (r1), the common source line CSL and unselected bit lines are applied with a second voltage and selected bit lines are applied with a third voltage lower than the second voltage, so that a current can flow in a selected cell string and no current flows in the unselected bit lines in a read operation.

4. The reading method according to claim 1, before the steps (r1), further comprising a step (r0) of:

applying the pass voltage to word lines (WL[k] to WL[n−1]), applying the pass voltage to the at least one word line adjacent to the selected word line WL[k] among the lower word lines, applying the first voltage having the opposite polarity to the pass voltage to the lower word lines except for the at least one word line, and applying a second voltage to a selected bit line, unselected bit lines and the common source line CSL.

5. The reading method according to claim 4, in a state where the cell string further includes a first selection device SD-1 and a second selection device SD-2 which are formed at respective ends of the control electrodes, the first selection device SD-1 is connected to a first string selection line SL[1] and the second selection device SD-2 is connected to a second string selection line SL[2], wherein in the steps (r0), the first string selection line SL[1] is applied with a third voltage to electrically connect a word line cell adjacent to the first selection device SD-1 with the bit line BL, and the second string selection line SL[2] is applied with a fourth voltage to electrically connect a word line cell adjacent to the second selection device SD-2 with the common source line CSL.

6. The reading method according to claim 1, in a state where the cell string further includes a first selection device SD-1 and a second selection device SD-2 which are formed at respective ends of the control electrodes, the first selection device SD-1 is connected to a first string selection line SL[1] and the second selection device SD-2 is connected to a second string selection line SL[2], wherein in the steps (r1), the first string selection line SL[1] is applied with a second voltage to electrically connect a word line cell adjacent to the first selection device SD-1 with the bit line BL, and the second string selection line SL[2] is applied with a third voltage to electrically connect a word line cell adjacent to the second selection device SD-2 with the common source line CSL.

7. The reading method according to claim 1, wherein in the steps (r1), in case of performing sensing all bit lines of a selected page having a plurality of cell strings, the common source line CSL is applied with a second voltage, and all the bit lines of the selected page is applied with a third voltage which is lower than the second voltage, so that a current can flow in all the plurality of cell strings of the selected page.

8. The reading method according to claim 1, in a state where the cell string further includes a dummy cell at at least one end of word line cells (WL[0] to WL[n-1] cells) in the cell string, wherein, in the steps (r1), in case where the dummy cell is at upper side of a selected word line cell (WL[k] cell), the dummy cell is applied with the pass voltage.

9. The reading method according to claim 1, in a state where the cell string further includes a dummy cell at at least one end of word line cells (WL[0] to WL[n-1] cells) in the cell string, wherein in the steps (r1), in case the dummy cell is at lower side of a selected word line cell (WL[k] cell), if the selected word line is a least significant word line, the dummy cell is applied with the pass voltage, and if not, the dummy cell is applied with the first voltage having an opposite polarity to the pass voltage.

10. A reading method for a cell string using multiple pass voltages, the cell string having n number of control electrodes formed on a semiconductor body (n: an integer), a gate insulating film stack formed between the semiconductor body and the control electrodes, first and second semiconductor regions formed at respective ends of the semiconductor body, and a first selection device SD-1 and a second selection device SD-2 which are formed at respective ends of the control electrodes, in a state where the n number of control electrodes of the cell string are connected to n number of word lines (WL[0] to WL[n-1]), respectively, the first semiconductor region is connected to a bit line BL, the second semiconductor region is connected to a common source line CSL, the first selection device SD-1 is connected to a first string selection line SL[1] and the second selection device SD-2 is connected to a second string selection line SL[2], when a selected word line is a word line WL[k] (0<k<n-1), the reading method comprising steps of:

applying a pass voltage having a same polarity to all the word lines except for the selected word line WL[k] in the cell string, and turning on any one of the first string selection line SL[1] and the second string selection line SL[2];

applying a first voltage which is lower than a read voltage ($V_{verify}$) to the selected word line WL[k];

applying a second voltage to all the bit lines and the common source line CSL; and applying a third voltage to the common source line CSL and unselected bit lines, applying the read voltage ($V_{verify}$) to the selected word line WL[k], and turning on both of the first string selection line SL[1] and the second string selection line SL[2] to perform a read operation, thereby reading information stored in the selected word line WL[k].

* * * * *